United States Patent
Naous et al.

(10) Patent No.: US 11,393,527 B2
(45) Date of Patent: *Jul. 19, 2022

(54) STOCHASTIC MEMRISTOR LOGIC DEVICES

(71) Applicant: King Abdullah University of Science and Technology, Thuwal (SA)

(72) Inventors: Rawan Naous, Thuwal (SA); Khaled Nabil Salama, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 9 days.

This patent is subject to a terminal disclaimer.

(21) Appl. No.: 16/922,255

(22) Filed: Jul. 7, 2020

(65) Prior Publication Data

US 2020/0335162 A1 Oct. 22, 2020

Related U.S. Application Data

(63) Continuation of application No. 16/606,786, filed as application No. PCT/IB2018/052524 on Apr. 10, 2018, now Pat. No. 10,748,609.

(60) Provisional application No. 62/487,758, filed on Apr. 20, 2017.

(51) Int. Cl.
  *H03K 19/20* (2006.01)
  *H03K 19/21* (2006.01)
  *G11C 13/00* (2006.01)

(52) U.S. Cl.
  CPC ......... *G11C 13/0021* (2013.01); *H03K 19/20* (2013.01); *H03K 19/21* (2013.01); *G11C 2213/15* (2013.01)

(58) Field of Classification Search
  None
  See application file for complete search history.

(56) References Cited

U.S. PATENT DOCUMENTS

| | | | | |
|---|---|---|---|---|
| 8,338,814 | B2 * | 12/2012 | Tsunoda | H01L 45/1675 257/2 |
| 8,587,988 | B2 | 11/2013 | Linn et al. | |
| 9,473,137 | B2 | 10/2016 | Miao et al. | |
| 9,490,010 | B2 * | 11/2016 | Buchanan | G11C 16/30 |
| 9,685,954 | B2 * | 6/2017 | Kvatinsky | H03K 19/0021 |
| 10,171,083 | B2 | 1/2019 | Swartzlander et al. | |

(Continued)

OTHER PUBLICATIONS

Search Report and Written Opinion for PCT/IB2018/052524 dated Aug. 3, 2018.

(Continued)

*Primary Examiner* — Alexander H Taningco
*Assistant Examiner* — James H Cho
(74) *Attorney, Agent, or Firm* — Billion & Armitage

(57) ABSTRACT

In accordance with the present disclosure, one embodiment includes a memristor that is caused to be in a particular resistance state by a voltage applied across terminals of the memristor. A first logical input and a second logical input that are below a threshold voltage of the memristor are applied to a first terminal of the memristor. A first control input and a second control input are applied to a second terminal of the memristor. A logical output is determined based on a resistance state of the memristor.

19 Claims, 9 Drawing Sheets

(56) References Cited

U.S. PATENT DOCUMENTS

| | | | |
|---|---|---|---|
| 2008/0246116 A1* | 10/2008 | Mouttet | G11C 13/003 257/544 |
| 2010/0220523 A1 | 9/2010 | Modha et al. | |
| 2017/0040982 A1* | 2/2017 | Miao | H03K 3/35625 |
| 2019/0056915 A1 | 2/2019 | Jabir et al. | |

OTHER PUBLICATIONS

Li, et al., "Realization of Functional Complete Stateful Boolean Logic in Memristive Crossbar", ACS Applied Materials & Interfaces, 2016, 34559-34567.

Linn, et al., "Beyond von Neumann-Logic operations in passive crossbar arrays alongside memory operations", Nonotechnology, 23, Jul. 10, 2012, 1-6.

Siemon, et al., "Advanced Funcational Materials", 2015, 6414-6423.

* cited by examiner

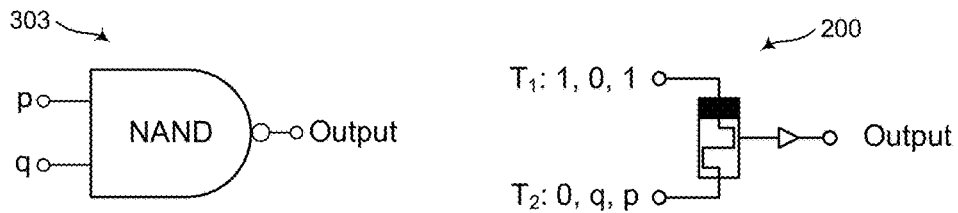
FIG. 3A
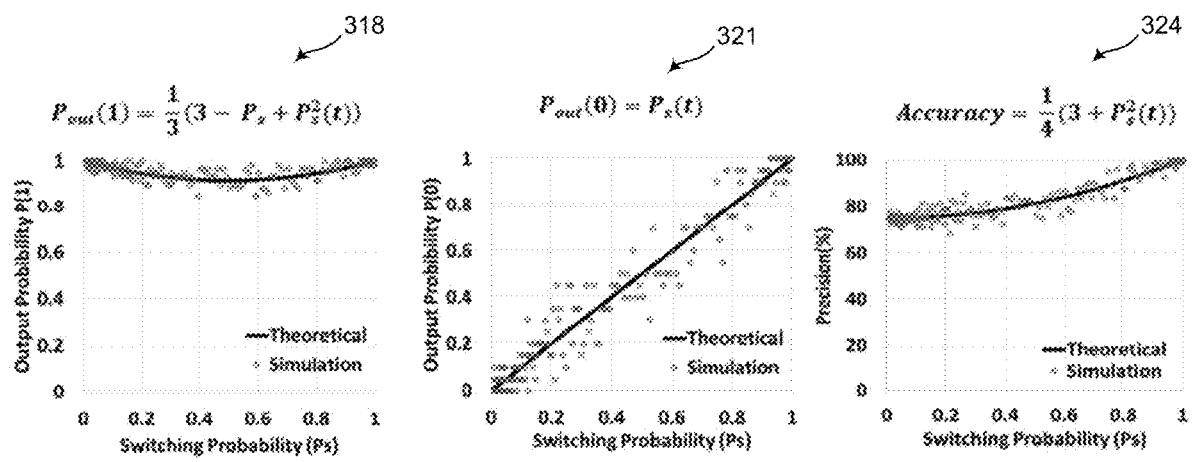
FIG. 3B
FIG. 3C

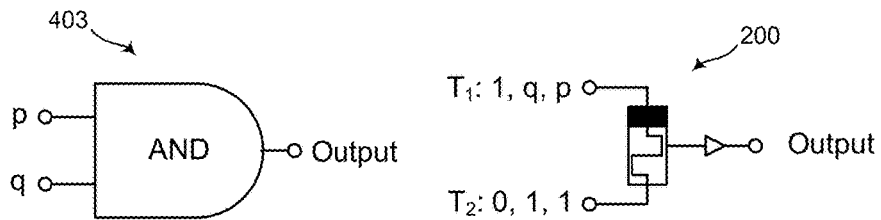
FIG. 4A
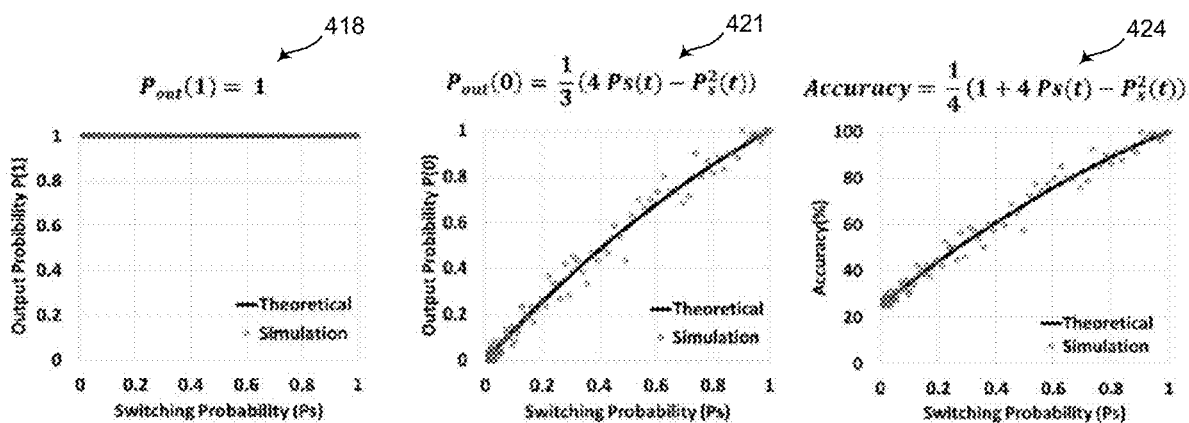
FIG. 4B
FIG. 4C

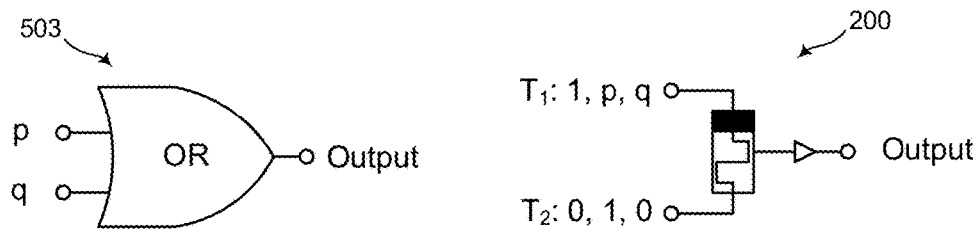
FIG. 5A
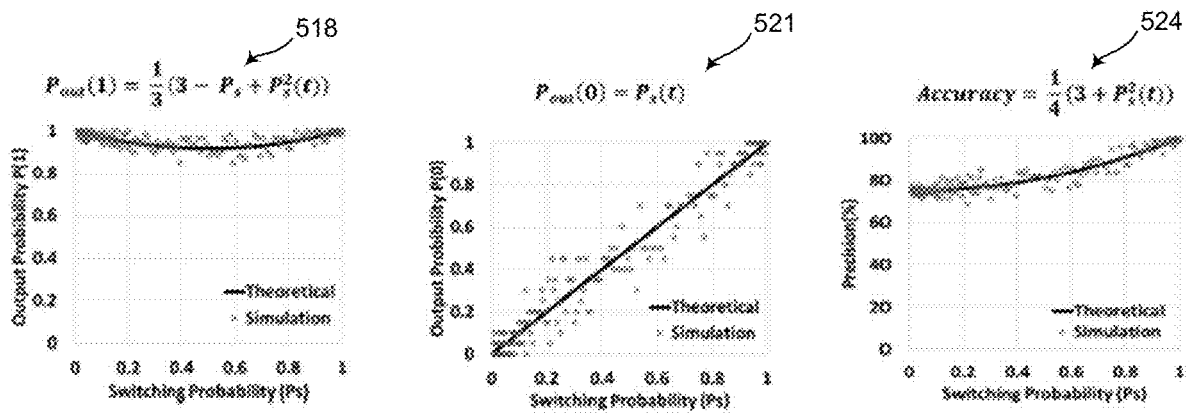
FIG. 5B
FIG. 5C

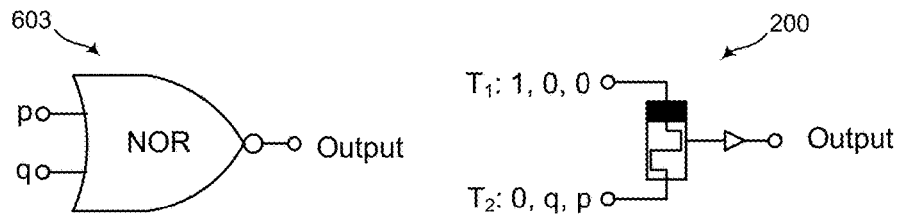
FIG. 6A
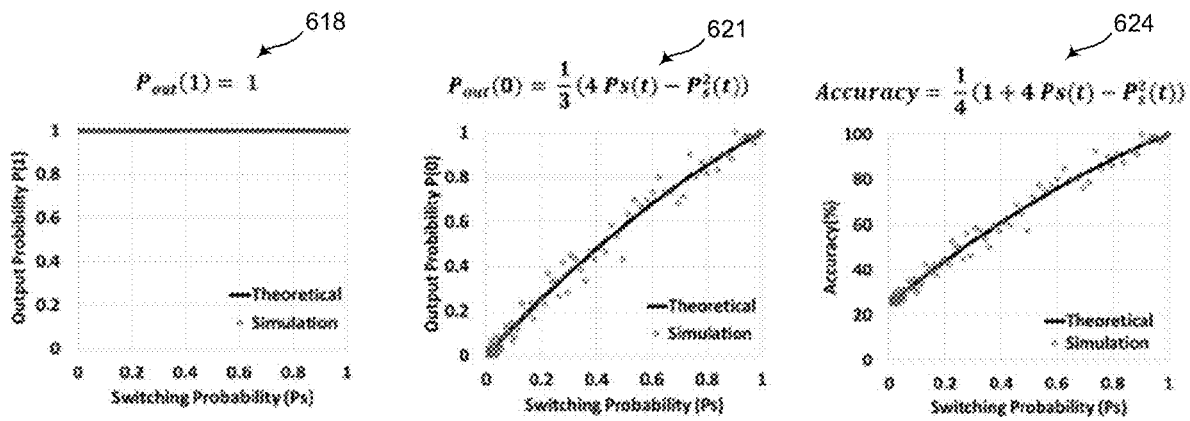
FIG. 6B
FIG. 6C

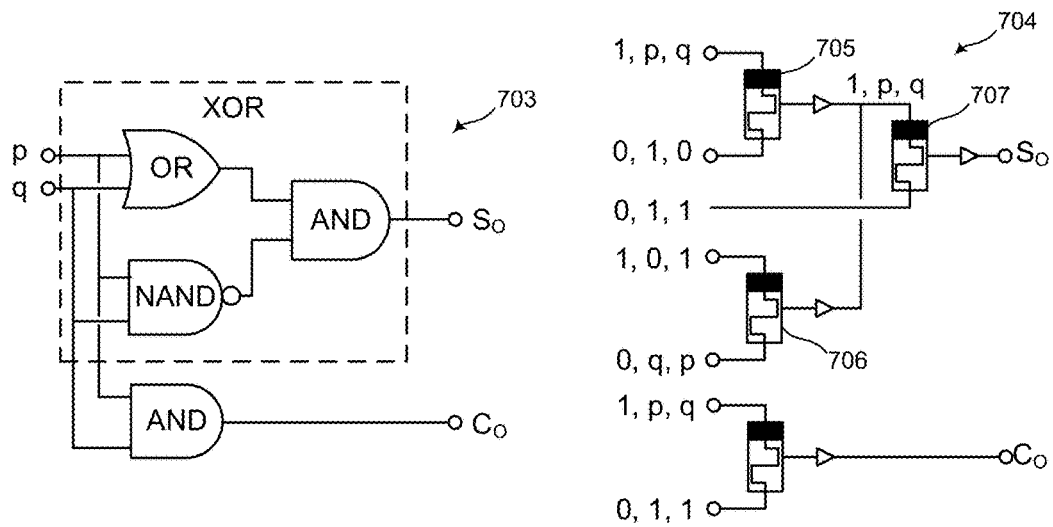
FIG. 7A
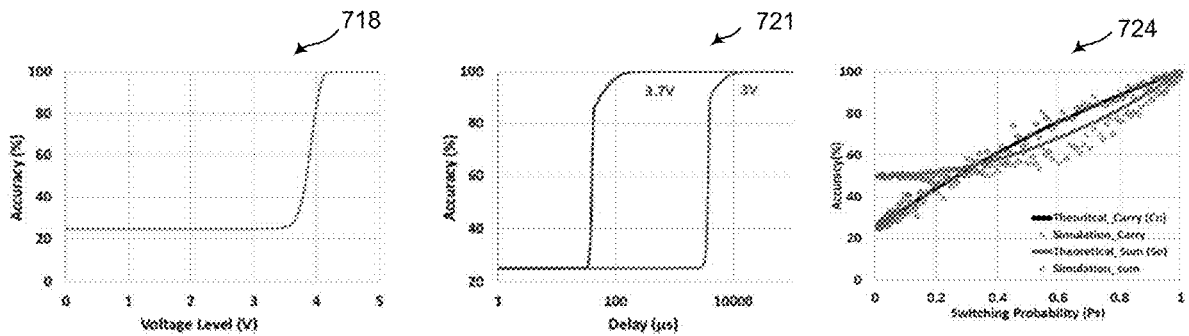
FIG. 7B
FIG. 7C

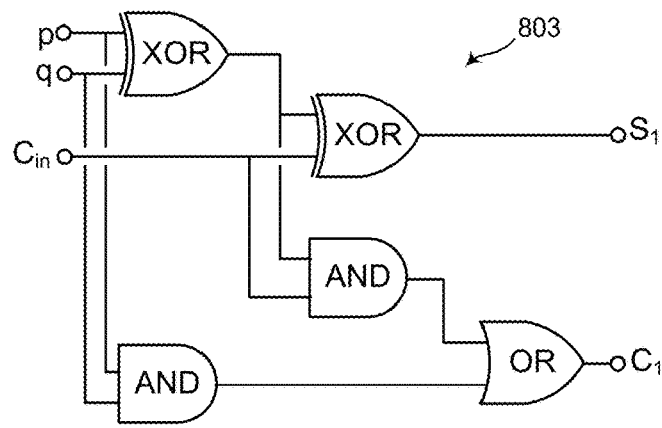
FIG. 8A
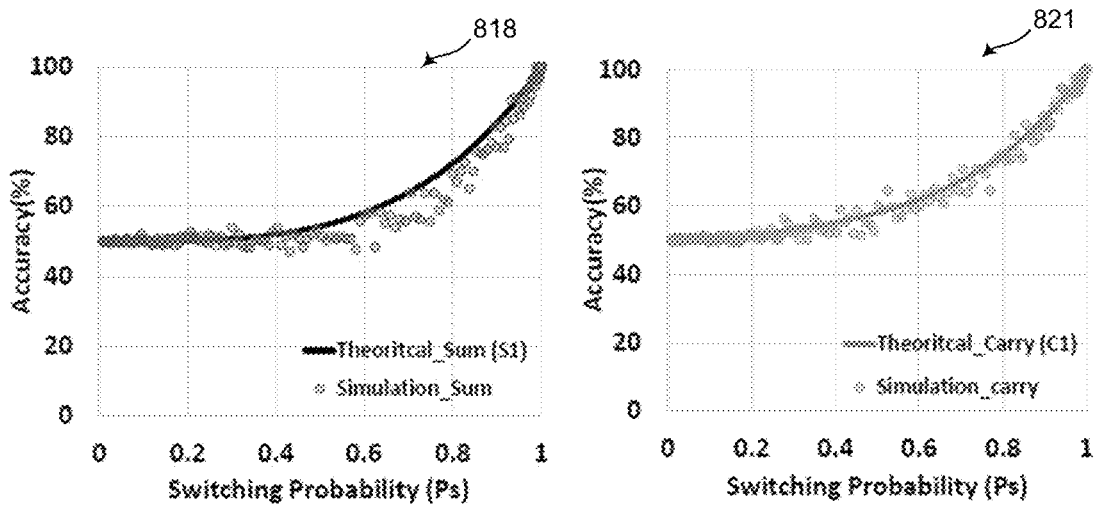
FIG. 8B
FIG. 8C

STOCHASTIC MEMRISTOR LOGIC DEVICES

BACKGROUND

Resistive random access memory (ReRAM), or the memristor, is one of the prominent devices of emerging non-volatile memory technologies. Conventional logic design often prioritizes the repeatability and accuracy of an operation. This practice pushes the use of the available resources up to its limits and can lead to overdesigning and costly error correcting schemes to ensure precision. However, when dealing with applications where the notion of accuracy is not formally set, extra design margins can be added. A tradeoff arises between the level of accuracy and other performance metrics such as energy efficiency and delay. Thus far, the memristor has been integrated into applications that target the current systems' repeatability and accuracy constraints.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 1A is an illustration of an example of a memristor and an example truth table of the memristor in accordance with the present disclosure.

FIGS. 3A-3C are illustrations and graphs that demonstrate the operation of a memristor logic device as a NAND gate in accordance with the present disclosure.

FIGS. 4A-4C are illustrations and graphs that demonstrate the operation of a memristor logic device as an AND gate in accordance with the present disclosure.

FIGS. 5A-5C are illustrations and graphs that demonstrate the operation of a memristor logic device as an OR gate in accordance with the present disclosure.

FIGS. 6A-6C are illustrations and graphs that demonstrate the operation of a memristor logic device as a NOR gate in accordance with the present disclosure.

FIGS. 7A-7C are illustrations and graphs that demonstrate the operation of a memristor logic device as a half-adder in accordance with the present disclosure.

FIGS. 8A-8E are illustrations and graphs that demonstrate the operation of a memristor logic device as a full adder in accordance with the present disclosure.

DETAILED DESCRIPTION

Embodiments of the present disclosure involve approximate computing based on stochastic memristor logic devices. It combines emerging technologies and unconventional computing approaches. Moreover, it introduces a circuit-based technique to achieve approximation and adaptability.

As discussed above, a tradeoff arises between the level of accuracy and other performance metrics such as energy efficiency and delay. As disclosed herein, a memristor can be used for variable or stochastic switching between two resistive states respectively. It offers opportunities to benefit from the intrinsic variations in investigating alternative approaches. This feature can increase performance and provide for reconfiguration and adaptability of arithmetic components and building blocks for image processing applications, quantum computing, and further applications.

The memristor can be used for realizing Boolean operators. Lowering the applied voltage levels shifts the memristor into a stochastic mode of operation. Variable switching behavior in this mode can lead to a probabilistic output for logic gates. approximate computing with memristor-based logic gates.

The principles disclosed herein relate to approximate computing based on stochastic memristive elements or memristor-based logic gates, along with the probabilistic analysis of the underlying behavior, and its impact on the overall performance. Moreover, it further introduces a circuit based technique to achieve approximation and adaptability. It essentially builds on the variability of the memristor that is related to the amplitude of the applied voltage along with the time period. This allows for configuring the accuracy, the energy level, and delay based on the design requirements and available resources. Hence, incorporating these elements within digital logic designs, the gates would then behave in a probabilistic manner With a mathematical distribution for the switching events, and a sequential logic approach, a formulation for the output of the gates and its corresponding cascades can be established. This accounts for the probabilistic feature of the gates and the corresponding arithmetic block structure.

With reference to FIG. 1A, depicted is a memristor 100 with two terminals, a terminal $T_1$ and a terminal $T_2$. A truth table 101 shows an example of the operation of the memristor 100, as will be discussed further below. The memristor 100 can be described as a non-linear circuit element that exhibits a change in its resistance based on the applied input bias. It is a non-volatile component that retains the value upon the removal of the input excitation. Two main variants are available with continuous and threshold-based behavior. The former undergoes a change with every level of voltage applied. The later on the other hand, does not show any change in case the applied voltage is below a set threshold, which primarily makes this type of devices suitable for the digital applications.

Figure 1B:
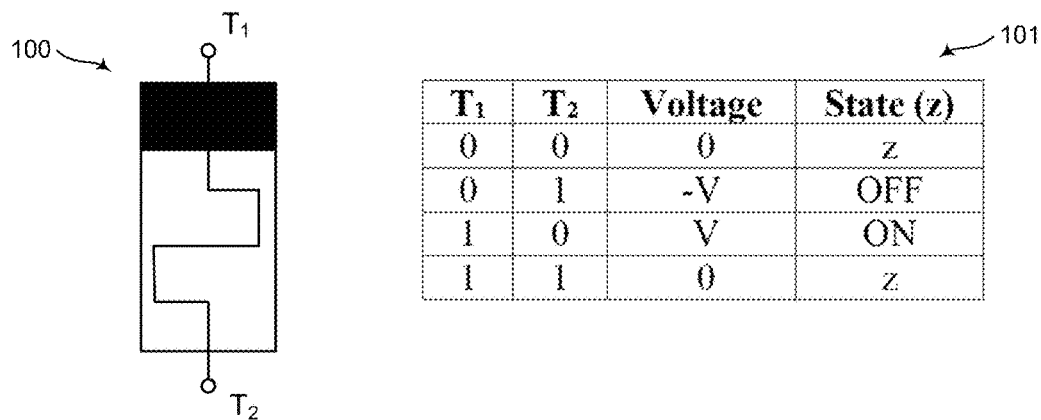
FIG. 1B illustrates a number of example graphs of performance characteristics of the memristor of FIG. 1A in accordance with the present disclosure.
Figure 1B:
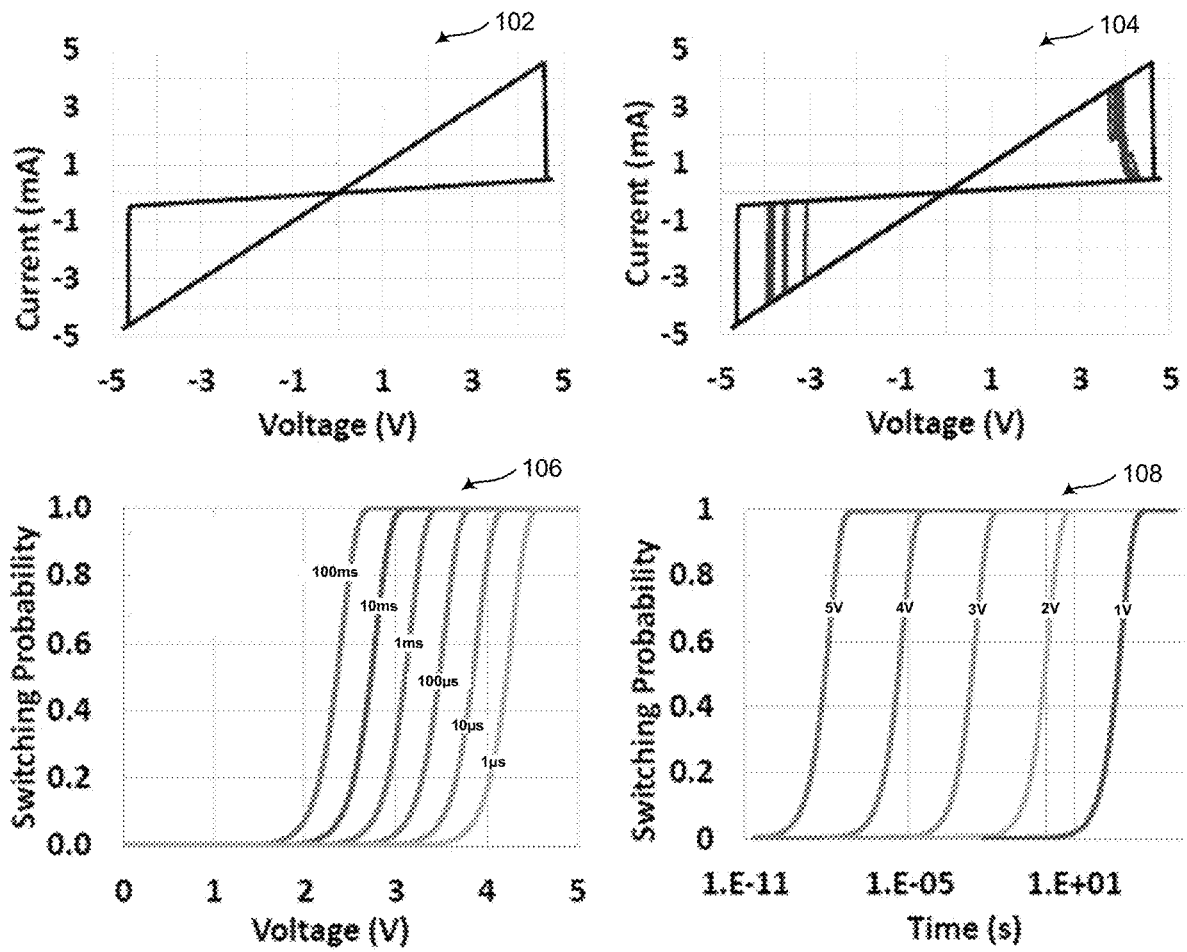

FIG. 1B shows graphs 102, 104, 106, and 108, which exhibit examples of performance characteristics of the memristor 100. The graph 102 shows a hysteresis that relates the voltage and current through the memristor 100.

Under the criteria of threshold based devices, several models are available in the literature that characterize this behavior. Either in direct fitting to the physical characteristics or mere abstraction to capture the threshold mechanism. For the modeling and simulation a bipolar model can be used. It offers a reliable and simple systematic approach to the resistance change and the intermediate state equations described as $$I = x^{-1} V_M \tag{1}$$

$$\frac{dx}{dt} = f(V_M) W(x, V_M) \tag{2}$$

Where x represents the resistance of the memristor. The functions $f(V_M)$ and $W(x, V_M)$ model the threshold property and the window function respectively as follows $$f(V_M) = \beta(V_M - 0.5)[|V_M + V_t| - |V_M - V_t|] \quad (3)$$

$$W(x, V_M) = \theta(V_M)\theta(R_{OFF} - x) + \theta(-V_M)\theta(x - R_{ON}) \quad (4)$$

θ corresponds to the step function applied within the window function to confine the range of the resistance values between the high $R_{OFF}$ and low $R_{ON}$ resistance states respectively. The rate of change is controlled by the parameter β, and the threshold voltage is set by $V_t$.

Aside from the generic modeling, the material characteristics play an important role in the underlying mechanisms of the memristor. The interfacial interactions of the internal composition can pose an added level of the operation, mainly the variability. In that perspective, different devices can show a stochastic feature, particularly in the switching between the two resistance states. In an abstraction scheme, the switching can be seen as an event occurring due to a set of input characteristics. The memristor operation can have a switching mechanism between resistance states that can be described or approximated by a mathematical distribution such as the Poisson. To add this variable operation into the available models, modification of the physical equations governing the state and the ionic interactions needs to be established. However, in one approach can portray the corresponding behavior by mapping the change into the threshold voltage. That is, the threshold voltage is not represented as a hard value but rather varies according to the input states in the sub-threshold regime. Important parameters in the variability can be the input voltage and the time period. The smaller the voltage applied, the longer it takes for the switching to occur, and vice versa. This can be shown by the graphs 106 and 108, which show switching probability as a function of voltage and time, respectively. The average time τ for the device to switch and the applied voltage are exponentially related $$\log_{10}(\tau) = \alpha V + \epsilon \quad (5)$$

With α and ϵ being fitting parameters that are determined based on the device fabrication and material used. The values can be extracted as −2.67 and 5.43 accordingly. Moreover, the probability of switching within a time interval t was found to be following a Poisson distribution.

$$P_s(t) = 1 - e^{-t/\tau} \quad (6)$$

The graph 104 shows the resultant outcome of the stochastic process as a characteristic hysteresis with added switching points below the threshold. Nonetheless, despite this variability, the memristor can remain suitable for logic operations as it can toggle between two stable states. The ON state corresponding to the set operation with moving to $R_{ON}$, and the OFF state with moving to $R_{OFF}$. Current sensing can be used to measure the output of the memristor. Accordingly, the low resistance state shows a high current that maps into digital '1', and the high resistance state gives a low current that corresponds to digital '0'. Probabilistic analysis and formulation can be used to incorporate the probabilistic element into the digital computing realm, as discussed below. Several designs can be for the memristor 100 in logic design. For example, the imply operator can be the basis for Boolean gates. Where two memristors and a load resistor are used to sequentially and conditionally set/reset output according to q'←p(imp)q. A CMOS-like logic can also be used, with polarized memristors resembling pmos and nmos transistors connected to form the complete set of the logic operators. A third approach builds on sequential logic, with several cycles needed to perform a logic operation such as a Boolean operation. In spite of the added cycles, only a single memristor is needed to perform 14 out of 16 logic operators. For example, AND, NAND, OR, and NOR can be performed with 3 cycles including an initialization cycle and two logical cycles that apply logical inputs to the terminals. Moreover, it all can be done within the compact memristive crossbar memory which paves the way for in-memory computing and further innovations as well. The basics of the sequential logic operations along with the added probabilistic outcomes are discussed further below.

The principles of operation of the sequential logic approach can use the two terminals of the memristor 100 as the inputs of any logic operator. Building on a bipolar switching, where opposite polarities are used for the SET and RESET of the memristor state of the memristor 100. A positive voltage, greater than the threshold, across the terminals $T_1$ and $T_2$ (e.g., $T_1 - T_2 > V_t$) would move the memristor into the ON state or '1', where as a negative voltage would shift it back to the OFF state or '0'. In this approach, no change is reflected in the memristor state (z) in case the terminals T1 and T2 are at the same potential.

Referring back to FIG. 1A, the truth table 101 shows this behavior. In order to realize a boolean operation, a sequence of cycles can be applied. For the logic gate, three cycles can be used to achieve the correct output of the operation. The first cycle can be considered an initialization cycle, where the memristor is put in a predetermined state, that would also facilitate the attainment of the required operation for the applied input parameters or logical inputs. For example, a logical '1' can be applied to $T_1$, and a logical '0' can be applied to $T_2$ as an initialization stage, where $T_1$ is greater than $T_2$. In other cases, $T_1$ can be set less than $T_2$ as an initialization stage. In some cases, $T_1 - T_2$ can be greater than the threshold $V_t$ for some operational versions. Considering a device with set/reset threshold voltage of ±4:6V, the applied voltage can be ±5V to ensure proper switching and state change. However, once a stochasticity mode is in place, lower voltages (e.g. below the threshold voltage $V_t$) can trigger the switching to a stable state that would not change unless the reverse polarity voltage is applied. Hence, the gates can then behave in a probabilistic manner, but allow for better energy efficiency. Thereby, giving rise to the concept of approximate computing. The analysis of the gates under probabilistic operation is discussed further below.

Figure 2:
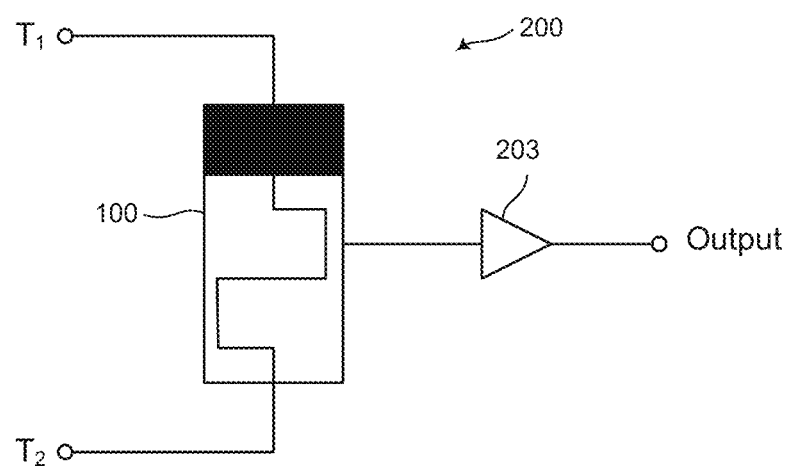
FIG. 2 illustration of an example of a memristor logic device in accordance with the present disclosure.

Referring now to FIG. 2, a memristor logic device 200 is shown, that can perform logic and can also be referred to as a logic gate. The memristor logic device 200 has a memristor 100 and an output circuit 203. The memristor 100 has terminals $T_1$ and $T_2$ that can be used to control a state of the memristor 100. The memristor logic device 200 can perform different logic operations by applying a series of inputs or input cycles to the terminal $T_1$ and $T_2$, which can be considered terminals of the memristor logic device 200. The inputs can be applied by circuitry, such as an input circuit that includes passive and active circuit elements or components. Such an input circuit can control the timing an sequencing of logical inputs that can be applied to the terminals such as a particular voltage, a ground, or an open circuit. The output circuit 203 can give an output at an output terminal of the memristor logic device 200. The output circuit 203 can, for example, use current sensing to determine a state of the memristor 100 after each of a number of inputs to the terminal $T_1$ and $T_2$. The state that is sensed can be utilized to generate a probabilistic logical output, that can in some cases be used in another logic device such as another memristor logic device (e.g., memristor logic devices can be cascaded). In some cases, the output circuit 203 can include passive circuit elements and/or active circuit elements such as op-amps.

Based on the sequential logic highlighted earlier, a single memristor behavior governs the output values. Hence, under sub-threshold excitation the memristor can be characterized by a probability of switching $P_s(t)$. With the incorporation of this variability, a set of assumptions can be used for analysis to ensure a common ground and to provide a simple overview of the expected outcome.
1) The initialization stage is deterministic
2) The inputs p and q to the logic gates are deterministic
3) The operation of the memristor is probabilistic with a generic switching probability $P_s(t)$ Thus, instead of having a certain correct output, the values are masked with the probability of switching and the sequence of applied input parameters. For each entry in the truth table, depending on the input setting, the certainty of having a correct output can be characterized by $P_{out}$. For each gate the output for every entry in the truth table can hold a probability to be correct. This probability can be determined by the switching probability of the memristor and the sequence of input application.

Moving to FIG. 3A, shown is a NAND gate 303, and a memristor logic device 200 that is configured to operate as a NAND gate. A series of control inputs along with logical inputs can be applied to the terminals $T_1$ and $T_2$ such that the memristor logic device 200 operates as a NAND gate. For example, a sequence of inputs can be applied to the memristor logic device 200 at the terminals $T_1$ and $T_2$, including an initialization cycle and two logical cycles. Note that in some cases the logical cycles can include logical inputs p and q being input sequentially to the memristor logic device 200 at one of the terminals $T_1$ and $T_2$ (e.g., in a particular order), while a specific set of control inputs are applied sequentially to the other one of the terminals $T_1$ and $T_2$.

In NAND operation, the first cycle can be an initialization cycle and can apply control input 1, to $T_1$ and control input 0 to $T_2$. The second cycle can apply a control input 0 to $T_1$ and a logical input q to $T_2$. The third cycle can apply a control input 1 to $T_1$ and a logical input p to $T_2$. The state of the memristor 100 of the memristor logic device 200 once the third cycle is performed can cause a probabilistic logical output of the memristor logic device 200. In some cases, the initialization cycle control input '1' can be deterministic. Also, the voltage of the control input '1' can be greater than the threshold Vt for the initialization cycle. In some cases, the logical inputs and/or control inputs after the initialization cycle can be a lower voltage (e.g., lower than Vt).

FIG. 3B includes a table 312 that shows one example of inputs to $T_1$ and $T_2$ that can cause the memristor logic device 200 to operate as a NAND gate. For example, the three cycles applied to $T_1$ can be (1, 0, 1) respectively, where the second two cycles (0,1) after the initialization input can be referred to as control inputs that can cause the memristor logic device 200 to operate as a NAND gate. The three cycles applied to $T_2$ can be (0, q, p) respectively, where q and p are logical inputs to the memristor logic device 200. The state of the memristor 100 of the memristor logic device 200 once the third cycle is performed can cause a probabilistic logical output of the memristor logic device 200. The probabilistic output of the memristor logic device 200 operating as a NAND gate for each set of logical inputs can be described by $P_{out}$, as shown in the equations in table 315.

Details in the analysis for a NAND gate and all remaining gates can follow [[the]] a similar construct and flow, but can have their own set of probabilities and consequent behavior.

For the input pair (p, q), four different combinations are available. For (p, q)=(0, 0), the first cycle can put the memristor in the ON state by applying control input 1, to $T_1$ and control input 0 to $T_2$. The second cycle will not have an effect on the state of the memristor as a zero potential can put across its terminals. For the third cycle, a positive potential may not have an effect in changing the state as it is already in the ON state. Thus, having the pair (0, 0) can always produce a correct output, and P(1)=1. For the pair (0,1), to get a correct one at the output, the memristor should switch to the ON state in the third cycle or it should not switch in the second and third cycles. The probability of getting the correct out for (0,1) is then $$P_{0,1}(1)=P_s(t)+(1-P_s(t))^2$$

$$P_{0,1}(1)=1-P_s(t)+P_s^2(t) \quad (7)$$

For the pair (1, 0), zero potential can be applied in the second and third cycles. This can move the initialization state directly to the output, so P(1)=1. For the pair (1, 1), the second cycle can determine whether the output is correct or not, as the third cycle has zero potential and the previous state would then impact the output. Thus, to have a correct '0' at the output, the memristor can switch to the OFF state in the second cycle. Thus, P(0)=$P_s(t)$. The overall probabilities of the NAND gate to get the '0' and the '1' correct at the output for the pair (1,1) are $$P_{out}(0)=P_s(t)$$

$$P_{out}(1)=\frac{1}{3}[3-P_s(t)+P_s^2(t)] \quad (8)$$

In FIG. 3C, graphs 318 and 321 show the output probabilities for $P_{out}(1)$ and $P_{out}(0)$, respectively. In each graph, the hard line represents the theoretical probabilistic analysis presented earlier. The points represent the simulation verification with the memristor element. The three cycle operation of the NAND gate can be applied on the memristor in sequence. All the truth table entries can be tested for 100 times each. The simulation can be run over a period of 1 ms and the voltage ranged between 2V and 4V accordingly. The number of matches can be counted for each run and the overall probabilities can be calculated based on the expected outcome for the gate. In addition to the single bit probabilities, the behavior of the gate can be further quantified with the notion of accuracy or precision. It can be specified as $$\text{Accuracy} = \frac{N_0}{N}P_{out}(0) + \frac{N_1}{N}P_{out}(1) \quad (9)$$

where N corresponds to the total number of entries in a particular truth table. Ni is the number of entries with the output set to '1', and No is the number of entries with the output set to '0'. The accuracy for the NAND operator can be calculated as 1 (10)

$$\text{Accuracy(NAND)}=\frac{1}{4}[3+P_s^2(t)]$$

Graph 324 shows the accuracy of the NAND gate with respect to the switching probability of the memristor. The theoretical precision attained can be verified with simulation of the memristor for 100 times for the all of the input pairs, and recording the output states. The NAND gates shows high accuracy starting from 75%. It is due to the deterministic initialization state that shifts the ON state to the output in two of the possible gate input combination. Hence, a large space for saving in terms of simple logic operation is possible with the scaling of the voltage and benefiting from the stochastic feature of the memristor 100. A similar analysis is conducted for all the remaining gates that require 3 cycles for operation, i.e. AND, OR, and NOR. When cascading the gates to form an arithmetic device that performs an arithmetic operation, a probabilistic dimension is added into the analysis and requires the accommodation of further parameters into account.

FIG. 4A shows an AND gate 403, with logical inputs p and q. FIG. 4A also shows the memristor logic device 200 configured to operate as an AND gate. A series of control inputs along with logical inputs can be applied to the terminals $T_1$ and $T_2$ such that the memristor logic device 200 operates as an AND gate. For example, the first cycle can be an initialization cycle and can apply control input 1, to $T_1$ and control input 0 to $T_2$. The second cycle can apply a logical input p to $T_1$ and a control input 1 to $T_2$. The third cycle can apply a logical input q to $T_1$ and a control input 1 to $T_2$. The state of the memristor 100 of the memristor logic device 200 once the third cycle is performed can cause a probabilistic logical output of the memristor logic device 200.

FIG. 4B includes a table 412 that shows one example of inputs to $T_1$ and $T_2$ that can cause the memristor logic device 200 to operate as an AND gate. For example, the three cycles applied to $T_1$ can be (1, p, q) respectively, where p and q are the logical inputs to the AND gate. The three cycles applied to $T_2$ can be (0, 1, 1) respectively, where 1,1 can be control inputs that cause the memristor logic device 200 to operate as an AND gate. The first cycle (e.g., where $T_1=1$, and $T_2=0$) can be referred to as an initialization cycle or initialization inputs. The state of the memristor 100 of the memristor logic device 200 once the third cycle is performed can cause a probabilistic logical output of the memristor logic device 200. The probabilistic output of the memristor logic device 200 operating as an AND gate for each set of logical inputs can be described by $P_{out}$, as shown in the equations in table 415.

FIG. 4C shows graphs 418, 421, and 424. Graphs 418 and 421 show the output probabilities for $P_{out}(1)$ and $P_{out}(0)$, respectively. In each graph, the hard line represents the theoretical probabilistic analysis presented earlier. The points represent the simulation verification with the memristor element. Graph 424 shows the accuracy of the AND gate with respect to the switching probability of the memristor.

FIG. 5A shows an OR gate 503, with logical inputs p and q. The memristor logic device 200 is shown with inputs configured to cause it to operate as an OR gate. A series of control inputs along with logical inputs can be applied to the terminals $T_1$ and $T_2$ such that the memristor logic device 200 operates as an OR gate. For example, the first cycle can be an initialization cycle and can apply control input 1, to $T_1$ and control input 0 to $T_2$. The second cycle can apply a control input 0 to $T_1$ and a logical input q to $T_2$. The third cycle can apply a control input 1 to $T_1$ and a logical input p to $T_2$. The state of the memristor 100 of the memristor logic device 200 once the third cycle is performed can cause a probabilistic logical output of the memristor logic device 200.

FIG. 5B includes a table 512 that shows one example of inputs to $T_1$ and $T_2$ that can cause the memristor logic device 200 to operate as an OR gate. For example, the three cycles applied to $T_1$ can be (1, p, q) respectively, where p and q are the logical inputs to the OR gate. The three cycles applied to $T_2$ can be (0, 1, 0) respectively, where the second two cycles (1,0) can be control inputs that cause the memristor logic device 200 to operate as an OR gate. The first cycle (e.g., where $T_1=1$, and $T_2=0$) can be referred to as an initialization cycle or initialization inputs. The state of the memristor 100 of the memristor logic device 200 once the third cycle is performed can cause a probabilistic logical output of the memristor logic device 200. The probabilistic output of the memristor logic device 200 operating as an OR gate for each set of logical inputs can be described by $P_{out}$, as shown in the equations in table 515.

FIG. 5C shows graphs 518, 521, and 524. Graphs 518 and 521 show the output probabilities for $P_{out}(1)$ and $P_{out}(0)$, respectively. In each graph, the hard line represents the theoretical probabilistic analysis presented earlier. The points represent the simulation verification with the memristor element. Graph 524 shows the accuracy of the OR gate with respect to the switching probability of the memristor.

FIG. 6A shows a NOR gate 603, with logical inputs p and q. The memristor logic device 200 is shown with inputs configured to cause it to operate as a NOR gate. A series of control inputs along with logical inputs can be applied to the terminals $T_1$ and $T_2$ such that the memristor logic device 200 operates as a NOR gate. For example, the first cycle can be an initialization cycle and can apply control input 1, to $T_1$ and control input 0 to $T_2$. The second cycle can apply a control input 0 to $T_1$ and a logical input q to $T_2$. The third cycle can apply a control input 0 to $T_1$ and a logical input p to $T_2$. The state of the memristor 100 of the memristor logic device 200 once the third cycle is performed can cause a probabilistic logical output of the memristor logic device 200.

FIG. 6B includes a table 612 that shows one example of inputs to $T_1$ and $T_2$ that can cause the memristor logic device 200 to operate as a NOR gate. For example, the three cycles applied to $T_1$ can be (1, 0, 0) respectively, where the second two cycles (0,0) can be control inputs that cause the memristor logic device 200 to operate as a NOR gate. The three cycles applied to $T_2$ can be (0, q, p) respectively, where p and q are the logical inputs to the NOR gate. The first cycle (e.g., where $T_1=1$, and $T_2=0$) can be referred to as an initialization cycle or initialization inputs. The state of the memristor 100 of the memristor logic device 200 once the third cycle is performed can cause a probabilistic logical output of the memristor logic device 200. The probabilistic output of the memristor logic device 200 operating as an OR gate for each set of logical inputs can be described by $P_{out}$, as shown in the equations in table 615.

FIG. 6C shows graphs 618, 621, and 624. Graphs 618 and 621 show the output probabilities for $P_{out}(1)$ and $P_{out}(0)$, respectively. In each graph, the hard line represents the theoretical probabilistic analysis presented earlier. The points represent the simulation verification with the memristor element. Graph 624 shows the accuracy of the NOR gate with respect to the switching probability of the memristor. Basic arithmetic operations can build on the main logic gates that can be formed by a combination of the principles disclosed herein.

FIG. 7A shows a half-adder 703, and a corresponding memristor half-adder 704. The memristor half-adder 704 is an arithmetic device that includes a memristor OR gate 705, a memristor NAND gate 706, and a memristor AND gate 707 composing an XOR gate. The memristor half-adder performs a half-adder operation, which is an arithmetic operation. For incorporating the stochastic memristor-based gates into an arithmetic operator, a basic building block can be a half adder. It can be mainly composed of an XOR gate for calculating the sum bit, comprising the OR gate 705, the NAND gate 706, and the AND gate 707. Another AND gate is used for the carry bit, as shown in the schematic of the half-adder 703. The logic equations for the output bits So and Co are $$S_o = p(\text{XOR})q \quad (11)$$

$$C_o = p(\text{AND})q \quad (12)$$

However, as illustrated earlier, only 4 out of the 6 logic gates operators are possible with a single memristor. The remaining gates of XOR and XNOR can be attained by a combination of the basic gates. For example, The XOR is obtained by applying the OR gate 705, and the NAND gate 706 to the inputs p and q and then putting the results back into the AND gate 707. The equation of the operation is $$p(\text{XOR})q = (p(\text{OR})q)\text{AND}(p(\text{NAND})q) \quad (13)$$

So, in order to analyze the behavior of this XOR gate, in this example the assumption of having deterministic inputs p and q may not hold valid. Especially at the input of the AND gate used to calculate the sum. For cascaded logic both inputs of the second stage logic can be probabilistic. The stochastic behavior of the memristor, and the gates in the first cycle can impose different input conditions on the following gates.

Note that because the logic is sequential, the cycles applied to each memristor gate can be designed to be staggered for proper sequential operation. For example, the third cycle (e.g. the output cycle) of the OR gate 705 may not complete at the same time as the third cycle of the NAND gate 706. Instead, they can complete sequentially, such that one of the gate outputs can be the logical 'p' and the other gate output can be the sequentially applied logical 'q' input to the AND gate 707. In some cases, there can also be circuits that apply the control input '1' to the top terminal of the AND gate 707 before the p and q inputs are received sequentially from the OR gate 705 and the NAND gate 706. In other cases, all inputs to the AND gate 707 can be probabilistic.

Further to the analysis of the AND gate, a distinct set of output probabilities can be formulated along with the precision of the sum and carry bit. The input probabilities can be assigned as $P_{in}(1)$ and $P_{in}(0)$. The probabilities for the inputs p and q are considered the same as they are coming from the outputs of the OR and NAND gates in the first stage that can exhibit similar probabilistic operation in terms of the output probabilities for '1' and '0'. The output probabilities for the AND gate with probabilistic inputs are $$P_{out}(0) = \tfrac{1}{3}(3 + (2P_{in}(0) - (1) - 2)P_s(t) + (1 - P_{in}(1) - P_{in}^2(0) + P_{in}^2(0)P_{in}(1))P_s^2(0) \quad (14)$$

$$P_{out}(1) = P_{in}(1)P_s(t) + (P_{in}(1) - 1)P_{in}(1)P_s(t) \quad (15)$$

FIG. 7B shows a truth table 709 for a half adder. The sum bit So can have two entries for '0' and two entries for '1'. Thereby, the accuracy or precision of the sum bit is specified as $$\text{Accuracy}(S_o) = \tfrac{1}{2}(P_{out}(0) + P_{out}(1)) \quad (16)$$

For the carry bit Co, the accuracy can be that of the deterministic input AND gate that was shown earlier in FIG. 5. It can be primarily dependent on the switching probability Ps(t) as its inputs can be deterministic.

$$\text{Accuracy}(C_o) = \tfrac{1}{4}(1 + 4P_s(t) - P_s^2(t)) \quad (17)$$

The theoretical analysis can also be verified with simulation of the gates based on the stochastic memristor.

FIG. 7C includes graphs 718, 721, and 724. Graph 718 shows the accuracy measure in response to the level of voltage applied across the terminals of the memristor. Savings up to 18% in the voltage can have a minor impact on the accuracy, which can decrease drastically with lower values. FIG. 721 shows the accuracy as a function of the delay for a voltage of 3.7V and 3V respectively. As depicted, the accuracy of operation of the adder can increase with larger application time overlying the probabilistic behavior of the memristor. A compromise can arise between the delay and the accuracy achieved for a particular input voltage. This feature of approximate computing can be highly efficient with higher bit adders, especially with the added saving per block. The graph 724 shows the accuracy for the sum and carry bit in the theoretical and simulation forms. As noticed, the performance of the sum bit starts off at 50% as two cases are present for the high bit and since the AND gate produces accurate '1'. The accuracy of the carry bit can start with a lower performance than the sum, but can catch up at a switching probability of 0.3, and can have better performance onward.

FIG. 8A shows a schematic of a full adder 803. In the half-adder, the XOR gate initiated with deterministic inputs. Thus, only the last AND gate required analysis with probabilistic inputs. However, the arithmetic block can be extended to include the carry in bit $C_{in}$, and an additional XOR operation can be performed to calculate the sum $S_1$. Whereas the carry requires two AND operations and an OR to get the final carry out $C_1$. FIG. 8B shows a truth table 812 for the full adder. The equations for the output bits can be specified as $$S_1 = (p(\text{XOR})q)\text{XOR } C_{in} \quad (18)$$

$$C_1 = (p(\text{AND})q)\text{OR}((p(\text{XOR})q \text{ AND } C_{in}) \quad (19)$$

The calculation of the output bits passes through several stages of gates. Hence, the inputs are not deterministic as the cascade induces the notion of variability or probabilistic outcomes. In a similar fashion to the analysis for the gates provided in the previous section, the output probabilities and the corresponding accuracy for each of the logic gates can be formulated based on non-deterministic input parameters. These equations can be tested with the output accuracy of the sum and carry bits.

FIG. 8C includes graphs 818 and 821, showing results of this analytical approach for S1 and C1, respectively. The simulation can include the theoretical formulation based on the probabilities of the inputs and its consequent relation and cascades. In addition, a system level simulation of the memristor element-based structure can be conducted. A 100 simulation runs for the full architecture were conducted, and the resultant output can be noted in regards to the expected output behavior for all the entries in the truth table 812.

Moreover, there can be a relatively small degradation for the full adder in comparison to the half adder. This is due to the fact that both bits $S_0$ and $S_1$ can be outputs of an XOR gate, but the first can be with deterministic inputs and the latter can be with probabilistic inputs. Thus, in this case the stochasticity can have a negative impact on performance. However, when comparing the carry bits $C_0$ and $C_1$, the performance can be enhanced with the added probabilistic operation. As shown, the accuracy of the full adder can have better performance up until around 0.3 probability of switching, after which, the accuracy for the half adder carry can show faster improvements.

Figure 8D:
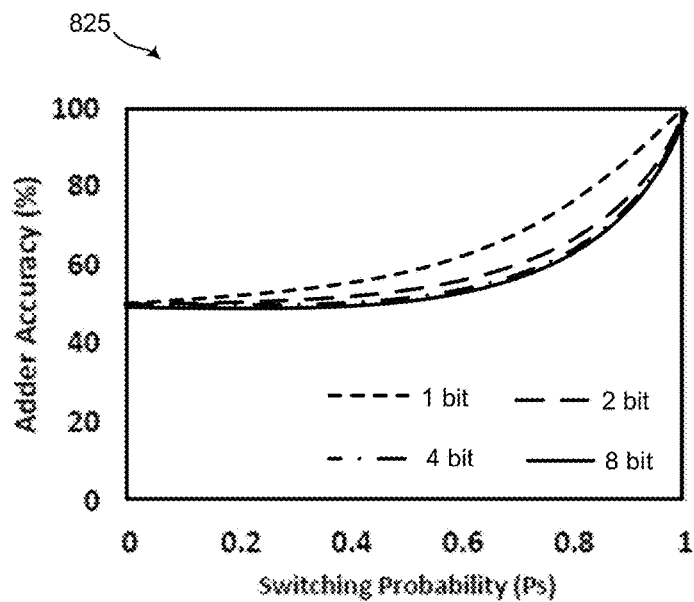

FIG. 8D includes a graph 825 that shows the sum accuracy plot with respect to the switching probability for various numbers of bits. To have a general overview of the system performance under several cascades, an N-bit adder can output characteristics as shown. A ripple-carry adder structure can be adopted. In some cases, degradation of performance can be saturated after 4 cascades. That is the accuracy of the sum bit, and similarly for the carry bit, can show a consistent behavior for adders with 4 bits and higher. That is, the effect of probabilistic components can fade or be balanced with the internal operation of the probabilistic internal adder blocks.

Figure 8E:
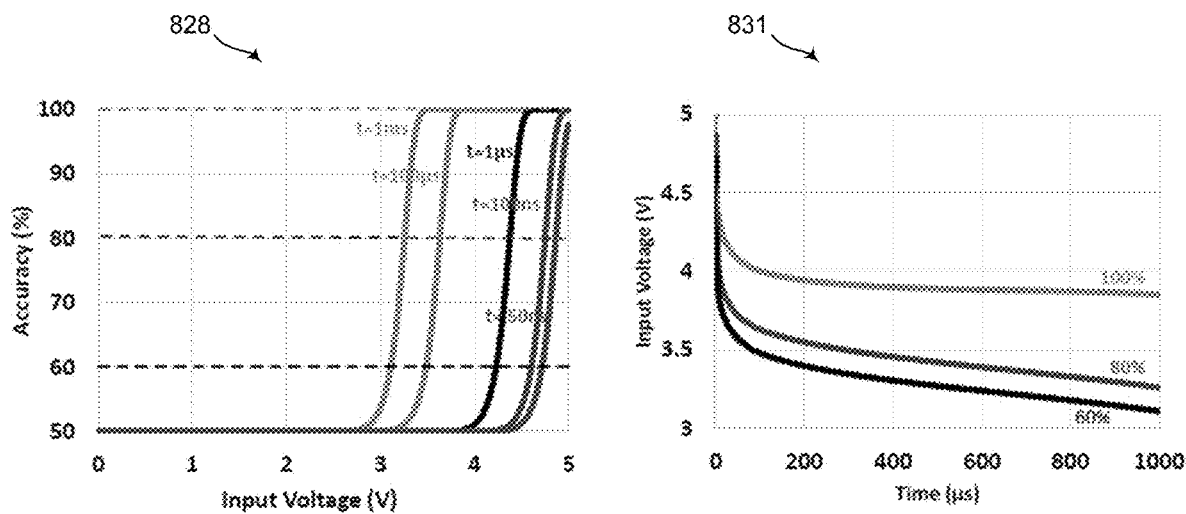

FIG. 8E includes a graph 828 and a graph 831. These graphs show examples of the configurable accuracy, delay, and energy relationship of the present disclosure. The graph 828 shows an example of accuracy as a function of voltage applied, for a number of time delays. The graph 831 shows an example of input voltage as a function of applied time period, for a number of precision measures. Depending on the applied time period, a 100% precision of operation can be achieved at a lower nominal voltage at the expense of longer delay. Fixed accuracy levels for a range of voltages and time can allow for diverse options in the design space allocation.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

The invention claimed is:

1. A method comprising:
   initializing a memristor by applying a voltage across a first terminal and a second terminal of the memristor, wherein initializing the memristor causes the memristor to be in a particular resistance state;
   applying a first logical input to the first terminal of the memristor and a first control input to the second terminal of the memristor, the first logical input being below a threshold voltage of the memristor;
   applying a second logical input to the first terminal of the memristor and a second control input to the second terminal of the memristor, the second logical input being below the threshold voltage of the memristor;
   determining a logical output of a memristor logic device comprising the memristor based on a resistance state of the memristor once the second logical input is applied; and
   determining a probability that the logical output is a correct logical output for a logic operation being performed by the memristor logic device.

2. The method of claim 1, wherein the memristor logic device is performing a logic operation at least in part by applying a first cycle, a second cycle, and a third cycle.

3. The method of claim 2, wherein the logic operation is at least one of an AND operation, an OR operation, a NAND, or a NOR operation.

4. The method of claim 1, wherein determining the logical output further comprises current sensing to detect the resistance state of the memristor.

5. The method of claim 1, wherein the memristor logic device is a first memristor logic device, and further comprising
   applying the logical output of the first memristor logic device to an input of a second memristor logic device; and
   performing an arithmetic operation using an arithmetic device comprising a plurality of memristor logic devices including the first memristor logic device and the second memristor logic device.

6. The method of claim 5, wherein performing the arithmetic operation further comprises:
   generating an arithmetic output of the arithmetic device; and
   determining a probability that the arithmetic output is a correct arithmetic output of the arithmetic operation.

7. An apparatus comprising:
   a memristor comprising a first terminal, a second terminal, and an output terminal,
   with a first sequence of inputs applied to the first terminal and a second sequence of inputs applied to the second terminal in a plurality of cycles comprising an initialization cycle that causes the memristor to be in a particular state;
   at least one logic cycle that applies a logical input to the first terminal and a control input to the second terminal, wherein a voltage across the first terminal and the second terminal remains below a threshold voltage of the memristor for the at least one logic cycle; and
   output circuitry that determines a probability that a logical output is a correct logical output for a logic operation being performed by the apparatus,
   wherein the logical output at the output terminal is based on a resistance state of the memristor once the first sequence of inputs is applied to the first terminal and the second sequence of inputs is applied to the second terminal.

8. The apparatus of claim 7, wherein the memristor logic device is configured to perform a logic operation that is at least one of an AND operation, an OR operation, a NAND, or a NOR operation based at least in part on the at least one logic cycle.

9. The apparatus of claim 7, further comprising an output circuit that performs current sensing to detect the resistance state of the memristor and generates the logical output at the output terminal.

10. The apparatus of claim 7, wherein the memristor is a first memristor, and further comprising:
    an arithmetic device that performs an arithmetic operation, the arithmetic device comprising the first memristor configured to perform a first logic operation; and
    at least one second memristor coupled to an output of the first memristor and configured to perform a second logic operation.

11. The apparatus of claim 10, further comprising output circuitry configured to:
    determine an arithmetic output of the arithmetic device; and
    determine a probability that the arithmetic output is a correct arithmetic output.

12. A logic device, comprising:
    a memristor comprising a first terminal, a second terminal, and an output terminal;
    input circuitry coupled to the first terminal, and the second terminal, the input circuitry configured to apply a sequence of inputs to the memristor to cause the memristor to operate as the logic device, wherein the sequence of inputs comprises:
    an initialization cycle that initializes a state of the memristor; and
    at least a first logic cycle that that includes applying a logical input to the first terminal and a control input to the second terminal, wherein a voltage across the first terminal and the second terminal remains below a threshold voltage of the memristor for a predetermined period of time; and output circuitry configured to determine a logical output at the output terminal based on a resistance state of the memristor once the sequence of inputs is applied, wherein the output circuitry is configured to determine a probability that the logical output is a correct logical output for a logic operation being performed by the memristor logic device.

13. The logic device of claim 12, wherein the logic device is configured to perform a logic operation that is at least one of an AND operation, an OR operation, a NAND, or a NOR operation based at least in part on the at least one logic cycle.

14. The logic device of claim 12 wherein said predetermined period of time corresponds to at least said first logic cycle.

15. The logic device of claim 12, wherein the output circuitry is further configured to:
perform current sensing to detect the resistance state of the memristor and generates the logical output at the output terminal.

16. The logic device of claim 12, wherein the logic device is configured to operate as a NAND gate, and wherein the sequence of inputs comprises:
the initialization cycle comprising applying a control input of 1 to the first terminal and a control input of 0 to the second terminal;
a first logic cycle comprising applying a control input of 0 to the first terminal and a logical input of q to the second terminal; and
a second logic cycle comprising applying a control input of 1 to the first terminal and a logical input of p to the second terminal.

17. The logic device of claim 12, wherein the logic device is configured to operate as a AND gate, and wherein the sequence of inputs comprises:
the initialization cycle comprising applying a control input of 1 to the first terminal and a control input of 0 to the second terminal;
a first logic cycle comprising applying a logical input of p to the first terminal and a control input of 1 to the second terminal; and
a second logic cycle comprising applying a logical input of q to the first terminal and a control input of 1 to the second terminal.

18. The logic device of claim 12, wherein the logic device is configured to operate as a OR gate, and wherein the sequence of inputs comprises:
the initialization cycle comprising applying a control input of 1 to the first terminal and a control input of 0 to the second terminal;
a first logic cycle comprising applying a control input of 0 to the first terminal and a logical input of q to the second terminal; and
a second logic cycle comprising applying a control input of 1 to the first terminal and a logical input of p to the second terminal.

19. The logic device of claim 12, wherein the logic device is configured to operate as a NOR gate, and wherein the sequence of inputs comprises:
the initialization cycle comprising applying a control input of 1 to the first terminal and a control input of 0 to the second terminal;
a first logic cycle comprising applying a control input of 0 to the first terminal and a logical input of q to the second terminal; and
a second logic cycle comprising applying a control input of 0 to the first terminal and a logical input of p to the second terminal.

\* \* \* \* \*